(12) United States Patent
Voigtlaender (10) Patent No.: US 7,932,724 B2
(45) Date of Patent: Apr. 26, 2011

(54) CIRCUIT ASSEMBLAGE AND METHOD FOR FUNCTIONAL CHECKING OF A POWER TRANSISTOR

(75) Inventor: Klaus Voigtlaender, Wangen (DE)

(73) Assignee: Robert Bosch GmbH, Stuttgart (DE)

( * ) Notice: Subject to any disclaimer, the term of this patent is extended or adjusted under 35 U.S.C. 154(b) by 249 days.

(21) Appl. No.: 12/084,309

(22) PCT Filed: Nov. 10, 2006

(86) PCT No.: PCT/EP2006/068327
§ 371 (c)(1),
(2), (4) Date: Dec. 31, 2008

(87) PCT Pub. No.: WO2007/060098
PCT Pub. Date: May 31, 2007

(65) Prior Publication Data
US 2009/0102504 A1    Apr. 23, 2009

(30) Foreign Application Priority Data

Nov. 24, 2005  (DE) .......... 10 2005 055 954

(51) Int. Cl.
G01R 31/08    (2006.01)
G01R 31/26    (2006.01)
(52) U.S. Cl. .................. 324/519; 324/555
(58) Field of Classification Search .......... 324/519, 324/512, 500, 769, 768, 765, 537, 555
See application file for complete search history.

(56) References Cited

U.S. PATENT DOCUMENTS

| 5,375,029 | A | * | 12/1994 | Fukunaga et al. ............ 361/101 |
| 5,920,452 | A | | 7/1999 | Sullivan |
| 6,137,138 | A | | 10/2000 | Hebert |
| 6,737,870 | B2 | * | 5/2004 | Okagaki et al. ................ 324/519 |
| 7,093,209 | B2 | * | 8/2006 | Mahanpour ...................... 438/15 |

(Continued)

FOREIGN PATENT DOCUMENTS

DE    40 26 398    2/1991

(Continued)

OTHER PUBLICATIONS

* "SGL160N6OUF Ultra-Fast IGBT" 2002, Fairchild Semiconductor Corporation, Internet, Retrieved from the Internet: URL:http://www.fairchildsemi.com/ds/SG/SGL 16)N6OUF.pdf.

(Continued)

Primary Examiner — Hoai-An D Nguyen
(74) Attorney, Agent, or Firm — Kenyon & Kenyon LLP (57) ABSTRACT

A circuit assemblage for functional checking of a power transistor includes a power transistor having an insulated gate, a first power electrode configured as a drain or as a collector, and a second power electrode configured as a source or an emitter, the first and second power electrode being connected to a power circuit having a DC voltage source and an electrical DC load. The circuit assemblage further includes a control application device having a signal output that is connected to the gate; a capacitance measuring device for measuring the gate terminal capacitance between the gate terminal contact and the second power electrode terminal contact; and an evaluation device for comparing the gate terminal capacitance with the gate capacitance, and outputting a fault signal as a function of the comparison.

21 Claims, 10 Drawing Sheets

U.S. PATENT DOCUMENTS

| | | | |
|---|---|---|---|
| 7,397,264 B2 * | 7/2008 | Dolian | 324/759.03 |
| 7,807,997 B2 * | 10/2010 | Yamaguchi | 257/48 |
| 2003/0146763 A1 | 8/2003 | Sunter | |

FOREIGN PATENT DOCUMENTS

| | | |
|---|---|---|
| DE | 43 34 386 | 4/1994 |
| DE | 10 2004 059643 | 6/2006 |

OTHER PUBLICATIONS

* Lembeye, Y. et al.: "Experimental characterization of an non linear electrostatic quadripole: application to insulated gate power components" Instrumentation and Measurement Technology Conference Proceedings, IEEE St. Paul, MN, USA May 18-21, 1998, New Yor, NY, USA, IEEE, US, vol. 1, May 18, 1998, pp. 525-529.

* cited by examiner

CIRCUIT ASSEMBLAGE AND METHOD FOR FUNCTIONAL CHECKING OF A POWER TRANSISTOR

BACKGROUND OF THE INVENTION

1. Field of the Invention

The present invention relates to a circuit assemblage and a method for functional checking of a power transistor, which are usable for power currents in vehicles.

2. Description of Related Art

Large currents in vehicles, especially those of motors or positioning devices, solenoid valves, and thermal loads, are increasingly being switched using MOSFETs and IGBTs. Both have, because of their insulated gate, a relatively high input resistance on the order of, for example $10^{12}$ ohm. When a voltage is applied from outside between the gate and source (in a MOSFET) or between the gate and emitter (in an IGBT), and the connection to the voltage source is then broken, the gate potential is retained for a relatively long time, e.g. several seconds, because of the high input resistance.

If an interruption occurs at the contact point because of aging or vibration, for example due to a break in the solder join or a detachment of the bond to the gate, the gate potential of the transistor can no longer be influenced from outside. If the transistor was previously in a conductive state, it will persist in that state and continue to allow power currents to pass. In the case of loads controlled solely by way of their power current terminals (such loads being common in vehicles), a shutoff is thus often no longer possible.

BRIEF SUMMARY OF THE INVENTION

The underlying idea of the present invention is to check the functionality of the power transistor, or the contact point between the gate and the control application device, by checking the gate capacitance between the insulated gate and the second power electrode connected to ground, i.e. the MOSFET source or the IGBT emitter. Because of their insulated gate, such power transistors have a gate capacitance on the order of, for example, 100 pF to 10 nF that should be measured if the contact point is OK. In the event of a break or detachment of the gate terminal contact between the gate and the signal output of the control application device, a distinct drop in the capacitance measured between the gate terminal contact and the terminal contact of the second power electrode may be expected, since a capacitance is now being created only by the separated ends of the contact point.

According to the present invention, commercially available power transistors can thus be used with no need, for example, to measure the flowing drain current or collector current, or even to influence the power current by way of additionally connected components. It is also unnecessary, for example, additionally to connect further components between the gate and the source or emitter, which components would on the one hand influence the electrical behavior of the power transistor and on the other hand require the use of special power transistors that are not commercially available. The gate capacitance measured according to the present invention is already constituted internally or intrinsically in the power transistor, and need not, for example, be applied externally in the housing or in the circuit. According to the present invention, however, other embodiments of the power transistor to elevate the gate capacitance are also possible in principle.

Further functional checks of the power transistor are possible according to the present invention. On the one hand, the gate capacitance, constituting the capacitance between the gate terminal contact and ground, is advantageously ascertained by the capacitance measuring device so that a defective contact point for the second power electrode (i.e. source or emitter) is also detected. Also possible on the other hand is a check for a short circuit among the three electrodes; it is possible in particular to ascertain a short circuit between the two power electrodes, the effects of said short circuit corresponding to the above-described defective continuous opening of the transistor. According to the present invention, the capacitance between the terminal contacts of the gate and of the second power electrode (i.e., in general, ground) is measured; considered in more detail, in a MOSFET this capacitance is produced on the one hand by a parallel circuit of the (dominant) gate-source capacitance, and on the other hand (via the feedback effect in the transistor) by the series circuit made up of the gate-drain capacitance and the drain-source capacitance, the additional contribution from the feedback in the transistor being small but nevertheless measurable. In the event of a short circuit between two electrodes, the respective contribution to the total capacitance drops out, and this can be correspondingly measured.

According to the present invention, the functional checking and/or functional plausibility check of the power transistor can be carried out both during operation and during operating off times. The measured or ascertained capacitance can be compared with a reference value, namely the known gate capacitance or a target value range of the gate capacitance, and as a function of the comparison a fault signal can be outputted that results, as applicable, in a shutoff of power to the connected DC load or in the output of a warning.

The additional frequency determination device and evaluation device necessary for this purpose can be configured, in accordance with various embodiments, with high efficiency and nevertheless a fundamentally simple construction. For this purpose, these devices are in principle already integrated into the control application device, in some cases also in software form.

According to an example embodiment, the frequency is ascertained by incorporating the gate capacitance into an oscillator. If the contact point is OK, an oscillator is thus constituted that exhibits the gate capacitance and, in general, further capacitances, in particular a coupling capacitor effecting DC voltage separation as well as, if applicable, further capacitors, the natural frequency of the oscillator constituted when the contact point is OK differing considerably from the natural frequency of the oscillator that is constituted when the gate contact point is defective.

Differing configurations of the oscillator are possible in this context; all that is relevant is that the oscillator or resonant circuit be connected in such a way that the gate capacitance sufficiently influences the resonant frequency and is connected to ground on one side.

According to an alternative example embodiment, a direct gate capacitance measurement is carried out. This means that the more-complex oscillator circuit can be omitted, and furthermore that no coil is necessary in the high-frequency region. in this context, a capacitance measuring device is provided in a first circuit portion, and a device for generating a signal is provided in a further circuit portion, the amplitude of the signal being proportional to the deviation from a target value.

The capacitance constituted between the gate terminal contact and ground (which capacitance ideally should correspond to the gate capacitance) can be determined in three different ways:

According to a first measurement method, an alternating voltage is applied to the gate capacitance, and the equilibrium shift in a bridge circuit is measured and displayed. According to a second measurement method, a resistance is additionally connected in front of the gate capacitance, and the equilibrium shift in a bridge circuit is measured and displayed. According to a third measurement method, a DC voltage is applied through a resistor to the gate capacitance, so that the gate capacitor charges; the time required for this to reach a certain voltage threshold can be measured, or the discharge time to a lower threshold voltage can be determined.

The circuit assemblage and method according to the present invention can also be utilized when an RC element is used for smoothing and/or time delaying of gate terminals, if the signal is picked off directly at the gate terminal contact. The measurements can be carried out during operation or (especially in a context of longer operating off times) outside the operating time. If pulse width modulation is used to apply control to the power transistor, intermediate measurements can also be performed in the pulse-free time intervals; advantageously, no modulation of the transistor is then performed.

BRIEF DESCRIPTION OF THE SEVERAL VIEWS OF THE DRAWING

FIGS. 3 through 8 show embodiments in which the gate capacitance is measured by way of an oscillator incorporating the gate capacitance.

FIGS. 11 through 18 show embodiments with direct measurement of the gate capacitance.

DETAILED DESCRIPTION OF THE INVENTION

Figure 1:
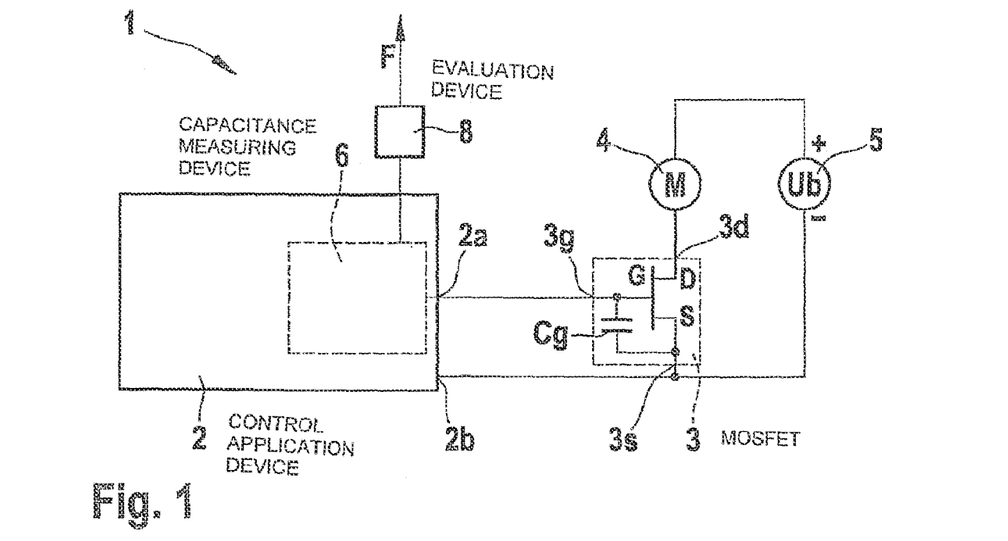
FIG. 1 is a block diagram of a circuit assemblage according to the present invention having a power circuit and a control application device, for functional checking of the power transistor, which is embodied as a MOSFET.

According to FIG. 1, a circuit assemblage 1 has a control application device 2 having a signal output 2a and a ground terminal 2b, a power transistor 3 according to the present invention (delimited by dashed lines) for power currents, an electrical DC load 4, and a vehicle voltage source 5 that supplies, for example, a vehicle voltage Ub=12 V. DC load 4 can be, for example, a DC motor, in particular a fan module, a water pump, or a positioning device, or additionally also, for example, a charge regulator or a solenoid valve. Control application device 2 can also, for example, be integrated into the housing of DC load 4 or into a central control device of the vehicle.

DC load 4 and power transistor 3 are connected, in a manner known per se, in series between the terminals of vehicle voltage source 5. In the embodiment of FIG. 1, power transistor 3 is a MOSFET 3 whose three electrodes G, S, and D are contacted via terminal contacts 3g, 3s, and 3d that can be, in particular, solder contacts or bond contacts. Gate G of MOSFET 3 is connected to gate terminal contact 3g, and the power electrodes (drain D and source S) are correspondingly connected to drain terminal contact 3d and source terminal contact 3s, respectively.

The equivalent circuit diagram of FIG. 1 depicts the gate capacitance Cg constituted in each MOSFET between the gate and source, which capacitance is on the order of 100 pF to 10 nF in power MOSFETs. Greater accuracy requires that the feedback through transistor 3 be considered, so that the gate capacitance Cg to be measured becomes a parallel circuit made up of the gate-source capacitance Cgs and a series circuit made up of the gate-drain capacitance Cgd and drain-source capacitance Cds, i.e.

$$Cg = Cgs + \left(\frac{x}{Cds} + \frac{y}{Cgd}\right)^{-1},$$

where x and y describe the feedback through the transistor, and the second summand $$\left(\frac{x}{Cds} + \frac{y}{Cgd}\right)^{-1}$$

is much smaller.

What is relevant here is simply that the gate capacitance Cg to be measured be known.

It is possible according to the present invention for a capacitance to be additionally inserted between gate G and source S, but this is not necessary and causes additional costs.

Provision is made according to the present invention for a capacitance measuring device 6 for measuring the gate terminal capacitance Cin constituted between terminal contacts 3g and 3s; said device measures the gate terminal capacitance Cin during operation (and, if applicable also during non-operation or during operating off times) and outputs a measurement signal to an evaluation device 8 that compares Cin with the gate capacitance Cg, checks whether Cin is within a tolerance range of the known value of the gate capacitance Cg, and outputs a fault signal as a function of that comparison.

Figure 2:
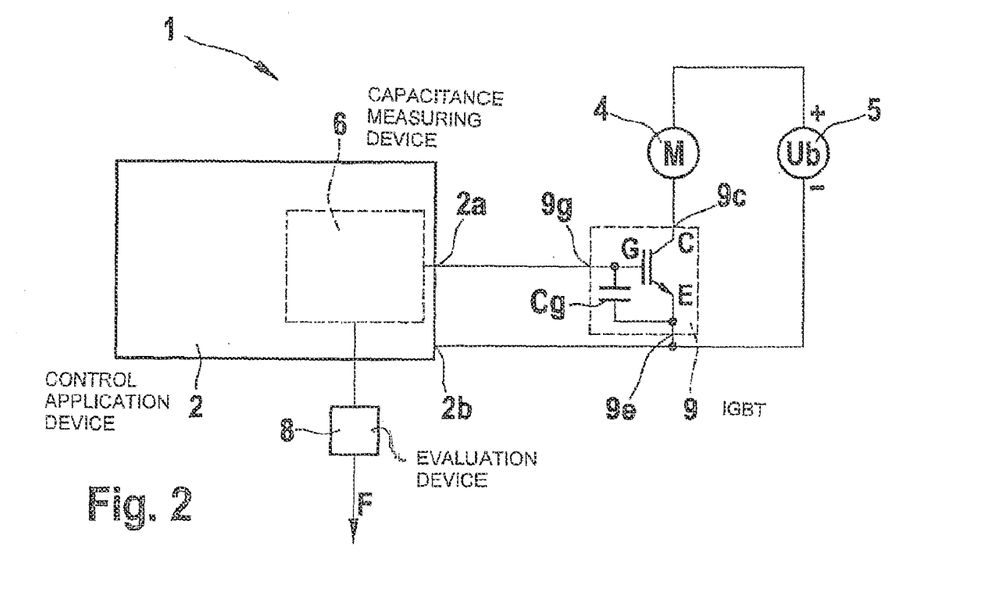
FIG. 2 is a block diagram corresponding to FIG. 1, with an IGBT as power transistor.

FIG. 2 shows a corresponding circuit assemblage 1 in which what is provided as a power transistor is an IGBT 9 that is connected at its gate G via gate terminal contact 9g, at its emitter E via emitter terminal contact 9e, and at its collector C via collector terminal contact 9c. With this power transistor 9 as well, the gate terminal capacitance Cin constituted between terminal contacts 9g and 9e is measured, and is compared with the known gate capacitance Cg.

FIGS. 3 Through 8 firstly show embodiments in which an oscillator is constituted from the gate capacitance Cg and, if applicable, further capacitors, together with at least one inductance; and deviations of Cin with respect to the known gate capacitance Cg can be ascertained as changes in the resonant frequency.

This is based on the idea according to the present invention that the gate capacitance is constituted internally in the case of both MOSFET 3 and IGBT 9 and is thus always located within terminal contacts 3g and 3s or 9g and 9e, respectively, and is therefore no longer connected in the event of a detachment or breakage of gate terminal contact 3g or 9g, respectively.

Figure 3:
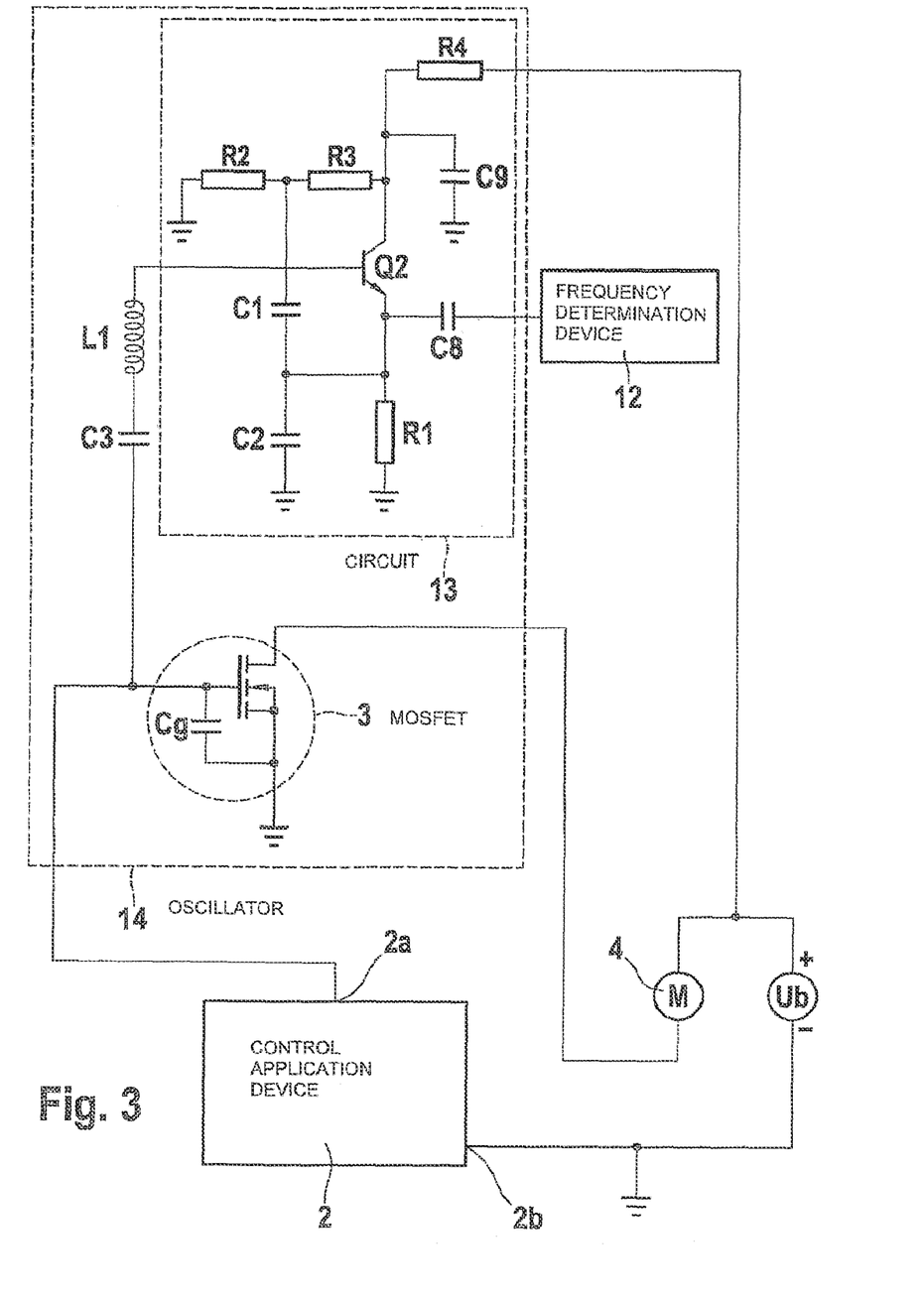
FIG. 3 is a circuit diagram of an embodiment of the block diagram of FIG. 1, depicting by way of example a Clapp oscillator (or series-tuned Colpitts oscillator).

FIG. 3 shows an embodiment in which a circuit 13 is connected to signal output 2a, or between signal output 2a and gate terminal contact 3g, said circuit constituting an oscillator 14 together with gate capacitance Cg and thus serving as a capacitance measuring device 6; a frequency determination device 12 is furthermore connected to the oscillator. Connected to signal output 2a or to gate terminal contact 3g are a capacitor C3 of, for example, 100 pF and a coil L1 having an inductance of, for example, 14 uH, through which a transistor Q2, in particular a bipolar transistor, has control applied to it; the transistor's collector is connected via R4 (of, for example, 100 ohm) to Ub, and additionally via C9 (of, for example, 1 nF) and series-connected resistors R2 (=15 kΩ) and R3 (=27 kΩ), to ground. Capacitors C1 (=1 nF) and C2 (=1 nF) are connected in series and connected between R2 and R3 and to ground. The emitter of transistor Q2 is connected via R1 (=1 kΩ) to ground, frequency determination device 12 being connected to the emitter via C8 (=33 pF). Different dimensioning is, as the skilled artisan knows, also possible.

Coil L1 and capacitors C1, C2, C3, and Cg constitute an oscillator circuit. C3 should, in this context, equal 0.05 to 0.2*Cg. In the event of a bond separation, Cin will then be equal to only a few pF. The result is that the resonant frequency rises substantially or even cuts off entirely. The variant selected in the experimental configuration yielded a resonant frequency of 4.4 MHz. This was far above the control application frequency (a few tens of kHz) of the pulse generator. No influence occurred on the operation of the EC motor that was used.

The oscillation thereby generated is directly evaluated in a suitable circuit, such as a frequency counter or F/U converter, serving as frequency determination device 12. This frequency can therefore be immediately compared with a standard frequency known from the functioning circuit, with no need to determine the capacitance.

Figure 4:
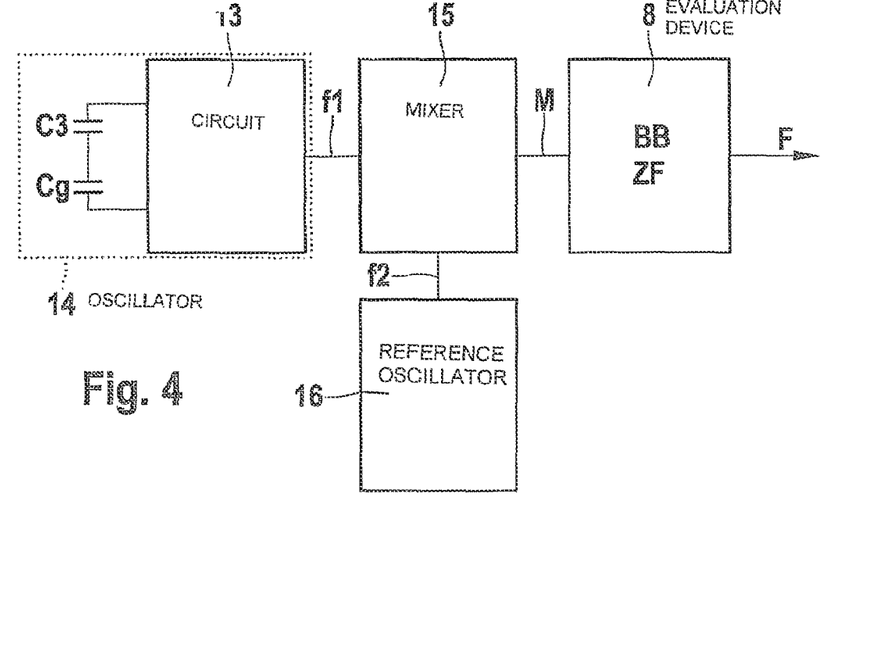
FIG. 4 is a block diagram of a circuit assemblage according to a further embodiment, having an oscillator and a mixer for downmixing into a baseband or intermediate-frequency band.
Figure 5:
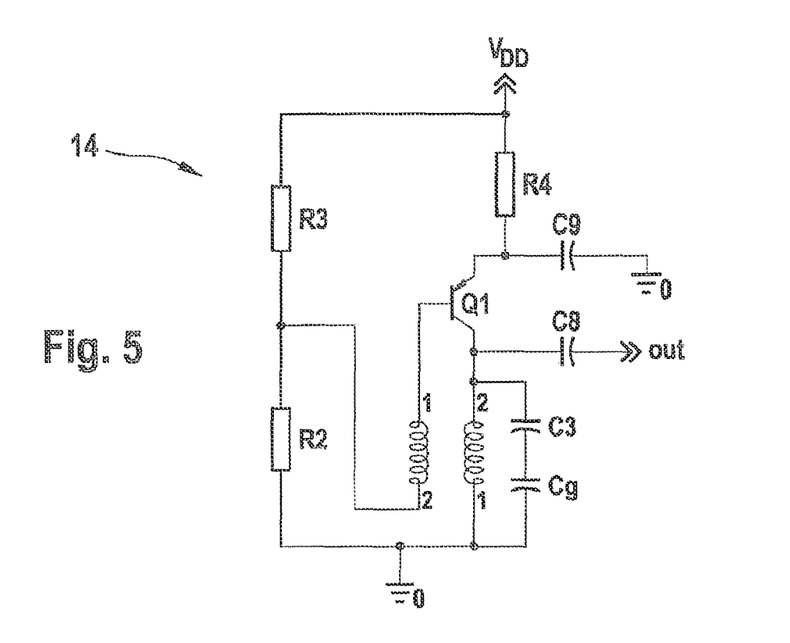
FIG. 5 is a circuit diagram having a Meissner oscillator for use in the circuit assemblage according to the present invention.
Figure 6:
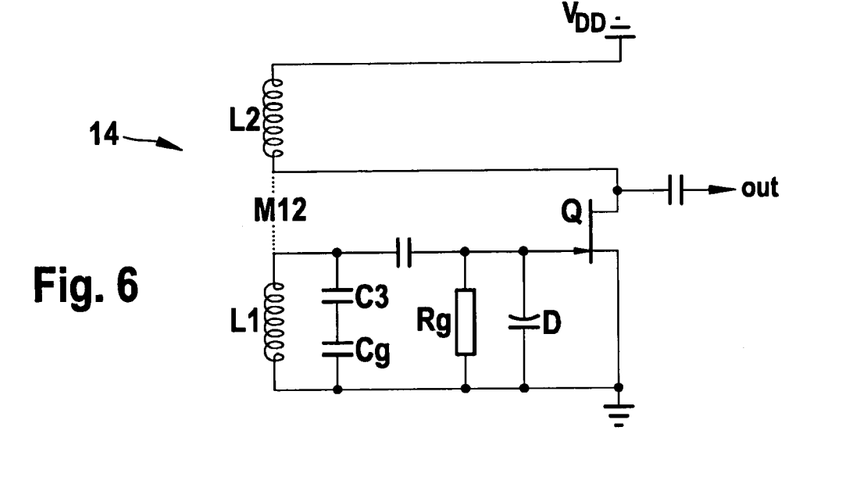
FIG. 6 is a circuit diagram of an Armstrong oscillator for use in the circuit assemblage according to the present invention.
Figure 7:
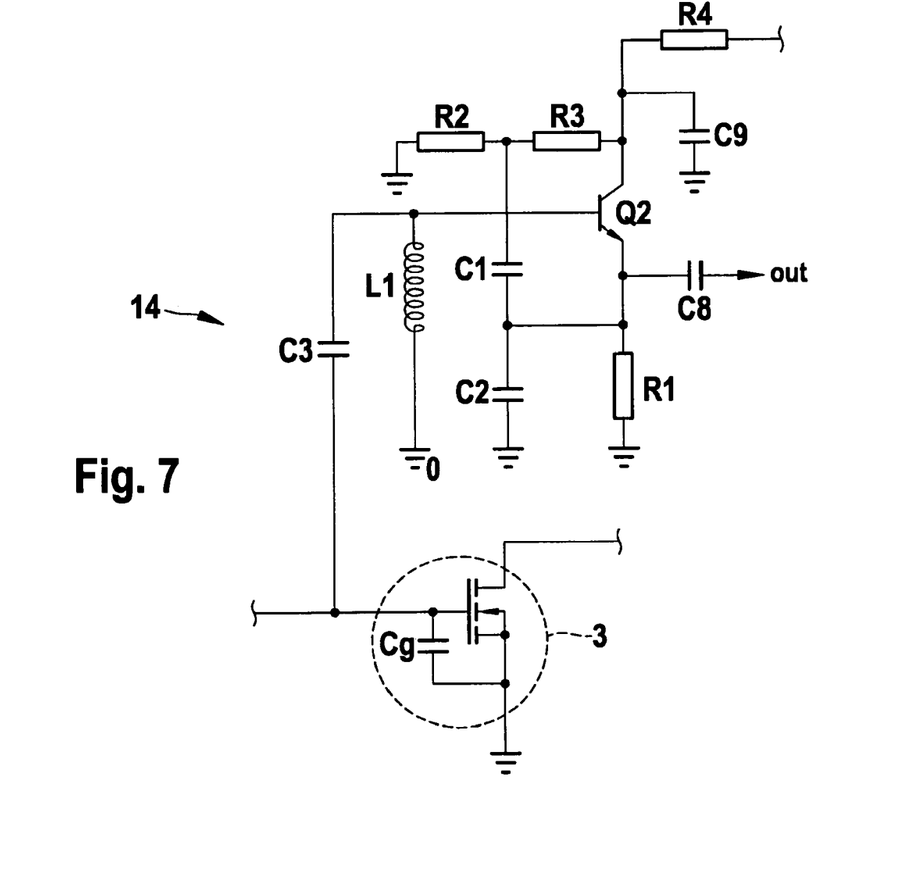
FIG. 7 is a circuit diagram of a parallel-tuned Colpitts oscillator for use in the circuit assemblage according to the present invention.
Figure 8:
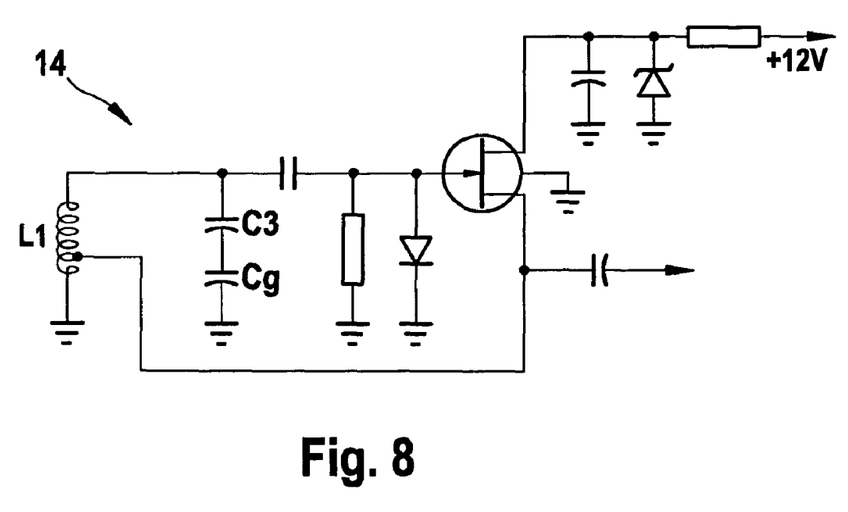
FIG. 8 is a circuit diagram of a Hartley oscillator for use in a circuit assemblage according to the present invention.

FIG. 4 shows a further embodiment in which the frequency f1 generated in oscillator 14 is downmixed in a mixer 15, with the reference oscillation (having a reference frequency f2) of a reference oscillator 16, into baseband BB or into a suitable intermediate frequency band ZF so that it can be evaluated there in evaluation device 8, using simple counter circuits or by amplitude evaluation or by being read into a microcontroller, with little effort and therefore inexpensively.

Fault signal F is then generated in the event of an oscillation breakdown or a change in frequency beyond the previously defined limits.

In all embodiments, fault signal F can serve to output a warning signal and/or to cause shutoff of the supply voltage Ub to load 4. In the circuit of FIG. 3, a series-tuned Colpitts oscillator 14, since in such an oscillator a capacitance is connected on one side to ground, and the gate capacitance Cg, or the series circuit of coupling capacitor C3 and gate capacitance Cg, can thus be used as that capacitance. FIGS. 5 to 8 show further oscillator variants, namely the linkage of capacitances Cg and C3 to yield a Meissner oscillator according to FIG. 5, an Armstrong oscillator according to FIG. 6, a parallel-tuned Colpitts oscillator according to FIG. 7, and a Hartley oscillator according to FIG. 8, which then exhibit a suitable DC voltage separation of gate capacitance Cg via decoupling capacitor C3.

Figure 9:
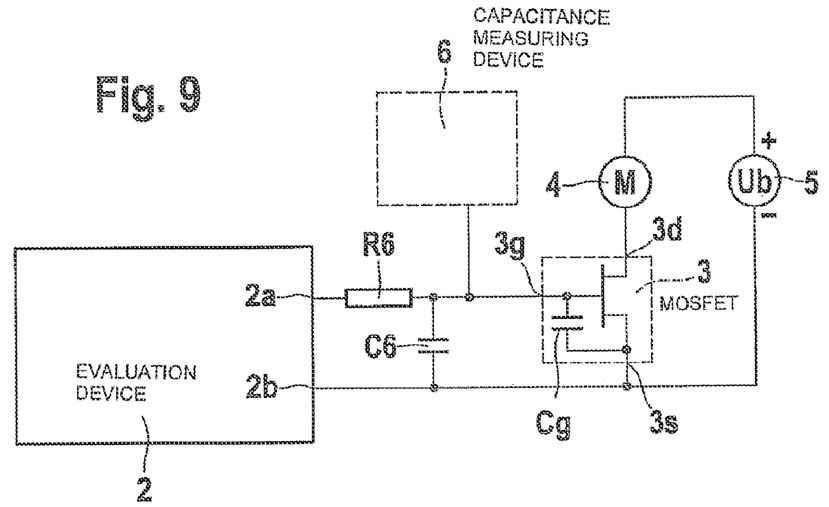
FIG. 9 shows a circuit assemblage corresponding to FIG. 1, having a MOSFET and an additional RC element provided in front of the gate terminal for smoothing and/or time delaying.
Figure 10:
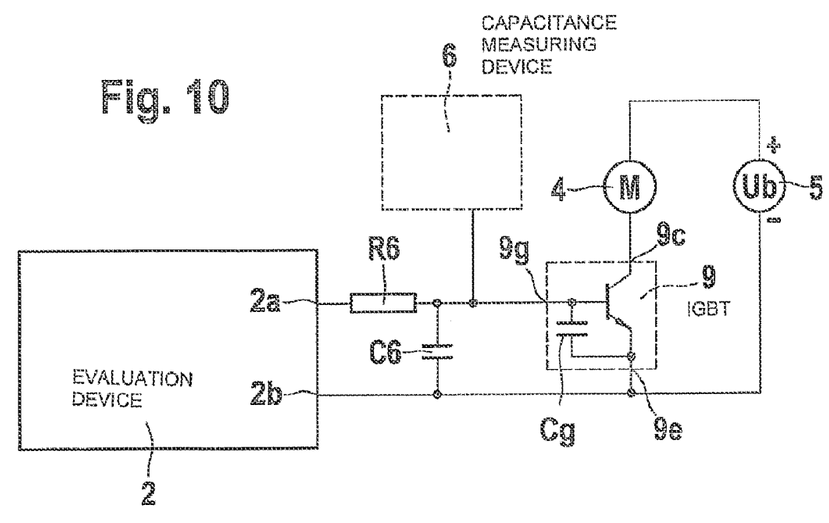
FIG. 10 shows a circuit assemblage corresponding to FIG. 2, having as power transistor an IGBT in which (in accordance with FIG. 16) an RC element is provided in front of the gate terminal or gate terminal contact.

In the circuit assemblage 1 of FIGS. 1 and 2, an RC element R6, C6 is often additionally provided in front of gate terminal contact 3g for smoothing and/or time delaying, as shown in FIGS. 9 and 10. In this case, according to the present invention, the frequency determination is not to be performed via resistor R6, but instead is accomplished directly by pickoff at gate G or at gate terminal contact 3g. The target value for the capacitance to be measured when the contact point is intact also increases to (Cg+C6), rather than the value Cg of FIGS. 1 and 2. This must be taken in account for evaluation and circuit design. C6 is therefore advantageously selected to be no greater than Cg, since otherwise the differences in the context of a bond separation are very small and can thus be confused with aging.

For the instance in which load 4 is not in operation for a long period but the connection to gate terminal contact 3g nevertheless needs to be checked, the respective oscillator 14 can be briefly supplied with voltage. Its oscillation frequency can then be evaluated as described above. Oscillator 14 can then be switched off again. The amplitude is advantageously so low that the respective power transistor, e.g. MOSFET 3 or IGBT 9 is not thereby brought into the conductive state. This condition is often met inherently because of the frequency decoupling and dielectric input parameters. The connection to gate G or gate terminal contact 3g can then be checked using, for example, the circuit assemblage shown in FIG. 3 or also the circuit assemblage of FIG. 4 having frequency conversion.

Figure 17:
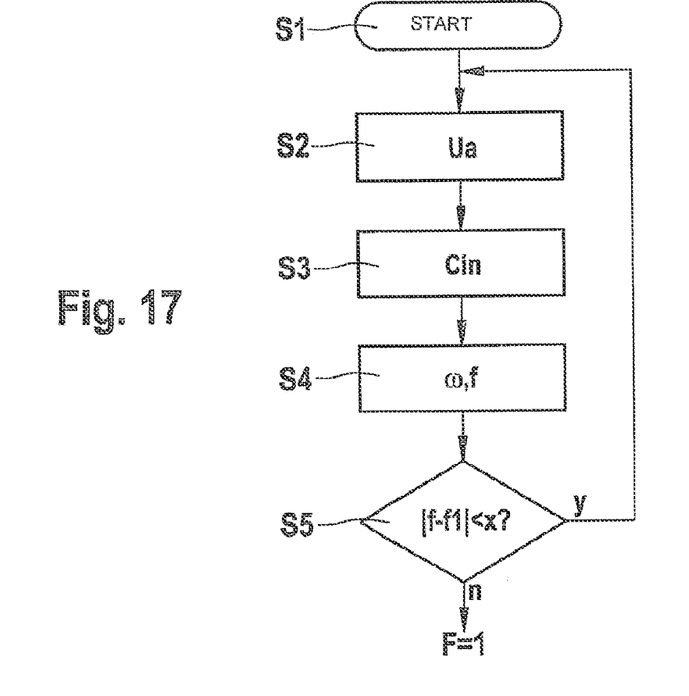
FIG. 17 is a flow chart of a first method according to the present invention.

FIG. 17 thus shows a flow chart of a method according to the present invention for functional plausibility testing or functional checking of power transistor 3, 9.

The method is started in step S1, and in step S2 the control voltage Ua is outputted at signal output 2a and thus applied to gate terminal contact 3g or 9g. In step S3 the gate terminal capacitance Cin constituted between terminal contacts 3g and 3s or 9g and 9e is incorporated into the respective oscillator 14. In step S4 the respective frequency f (or $2\pi f=\omega$) is determined in frequency determination device 12, and decision step S5 checks whether the frequency f of oscillator 14 deviates only within a tolerance value x from the known reference frequency f1 when Cg is used. If this is the case, the method is reset to before step S2 in accordance with branch y; if not, a positive fault signal F=1 is outputted in accordance with branch n.

FIGS. 11 through 16 show embodiments in which the gate terminal capacitance Cin is measured according to the present invention by way of a direct capacitance measurement. In this context, Cin can be determined, for example, in three different ways:

Measurement Method 1:

An alternating voltage Uw is applied to gate capacitance Cg via a further capacitor C40 that simultaneously serves for DC separation. An equilibrium shift in a bridge circuit is measured and displayed.

Measurement Method 2:

An alternating voltage Uw is applied through a resistor R40 to the gate capacitance C. An equilibrium shift in a bridge circuit is measured and displayed.

Measurement Method 3:

A DC voltage Up, e.g. a pulsed DC voltage, is applied through a resistor R40 to the gate capacitance Cg. Capacitor Cg charges, and the time required for this to reach a specific threshold Uschw1 is measured. As a substitute, the discharge time of the capacitance (once charged to a specific value Uschw2) can also be determined.

As shown in the table below, the values of the complex resistances are on the order of 100 ohm to 10,000 ohm, and can thus easily be determined in the kHz to MHz range. It is therefore possible to select both lower frequencies that can still be evaluated with operational amplifiers, and high-frequency systems (typically 50 ohm).

| Value of Z [ohm] | f = 10 kHz | f = 100 kHz | f = 1 MHz | f = 10 MHz |
| --- | --- | --- | --- | --- |
| C = 1000 pF | 16 k | 1.6 k | 160 | 16 |
| C = 100 pF | 160 k | 16 k | 1.6 k | 160 |

Figure 11:
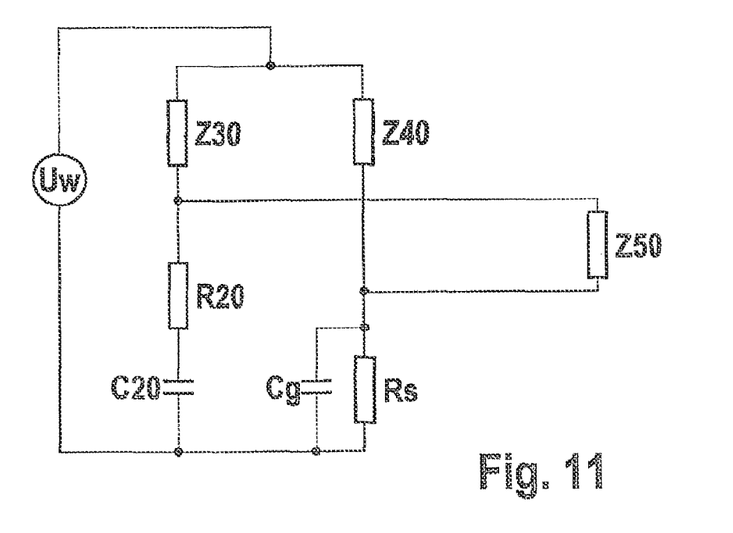
FIG. 11 shows a circuit in which an alternating voltage is applied to the gate capacitance, and an equilibrium shift in a bridge circuit is measured and displayed.

FIG. 11 shows an embodiment for the first measurement method, the complex resistances Z30, Z40 firstly being assigned as purely imaginary values, namely capacitors C30, C40. A bridge circuit is constituted from Cg and C40 and two further capacitances C20 and C30 (i.e. Z30 is purely imaginary). Cg and C20 are connected to ground on one side. An alternating voltage Uw having the aforementioned frequency and a suitable amplitude is then applied to nodes C30, C40. This voltage is selected so that in the rest state, the transistor is not activated. The amplitude can also be set by way of the capacitative voltage divider C40/Cg. A current flows between the nodes Cg, C40, and C20 only when the bridge has been shifted out of equilibrium. This happens, for example, when the gate terminal capacitance Cin in the circuit has changed with respect to the value of the gate capacitance Cg because of a bond separation (or similar faults), i.e. Cin is not equal to Cg.

In the second measurement method, two resistors R20 and R30 are used instead of the capacitors. A generalized bridge will be discussed below, however.

FIG. 11 shows the general procedure for measurement methods 1 and 2 when not only pure resistances or capacitances are present. The input resistance of the transistor is very high, but as a result of the additional control application circuit, it can in fact drop into the low-impedance region. A compensated bridge as shown in FIG. 11 is therefore advantageous. Considering that Rs→∞ and R20→0, however, it transitions into the bridge described above. In addition, the following abbreviations are also used:

$$\frac{1}{Z_{10}} = \frac{1}{R_S} + j\omega C g \text{ and } Z_{20} = R_{20} + \frac{1}{j\omega C_{20}}$$

The bridge is in equilibrium when the following conditions are met:

$$\left|\frac{Z_{10}}{Z_{40}}\right| = \left|\frac{Z_{20}}{Z_{30}}\right| \text{ and } \varphi 10 + \varphi 30 = \varphi 20 + \varphi 40,$$

such that $Z_i = |Z_i| e^{j\Phi i}$ where i=10, 20, 30, 40

Out of equilibrium, a current that rises nonlinearly with detuning flows through resistor R50:

$$I_i = U_w \frac{Z_{20} Z_{40} - Z_{10} Z_{30}}{Z_{10} Z_{40}(Z_{20} + Z_{30}) + Z_{20} Z_{30}(Z_1 + Z_{40}) + R_{50}(Z_{10} + Z_{40})(Z_{20} + Z_{30})}$$

In the case of the compensated bridge having Rs, Cg, and R20, C20, the following simple conditions are obtained for designing the equilibrium state:

$$\omega^2 R_s C_g R_{20} C_{20} = 1 \text{ and } \frac{R_{20}}{R_s} + \frac{C_g}{C_{20}} = \frac{R_{30}}{R_{40}} \text{ or } \frac{R_{20}}{R_s} + \frac{C_g}{C_{20}} = \frac{C_{40}}{C_{30}}$$

for the case of real or capacitative components 30 and 40.

Figure 12:
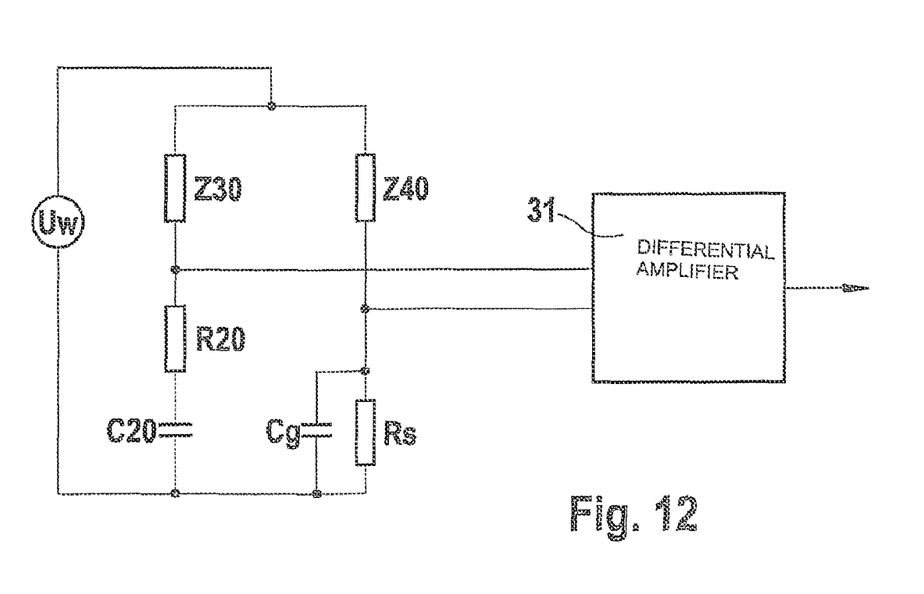
FIG. 12 shows an embodiment corresponding to FIG. 11, having a differential amplifier instead of a current measurement system.
Figure 13:
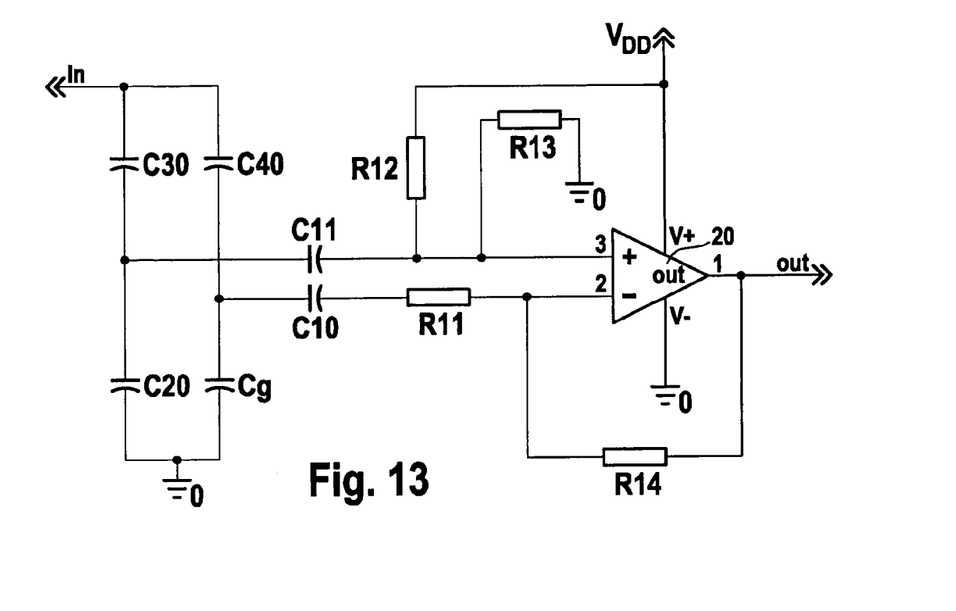
FIG. 13 shows a first implementation of the circuit of FIG. 12.
Figure 14:
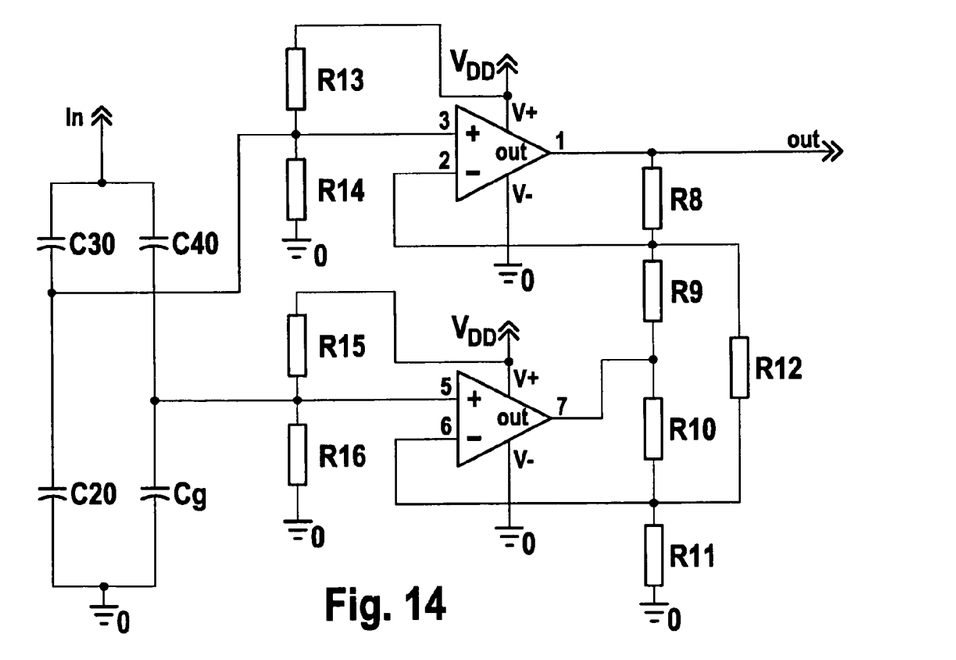
FIG. 14 shows a second implementation of the circuit of FIG. 12.

Instead of the current measurement in resistor R50, according to the present invention differential amplifier 31 depicted in FIG. 12 can also be used for evaluation. It is dimensioned so that it generates a signal proportional to the deviation. That signal is analyzed by an evaluation stage, i.e. an evaluation device 8 of FIGS. 1 and 2, and is used to output fault signal F if the tolerance band is exceeded. Two implementation examples are indicated in FIGS. 13 and 14.

Figure 15:
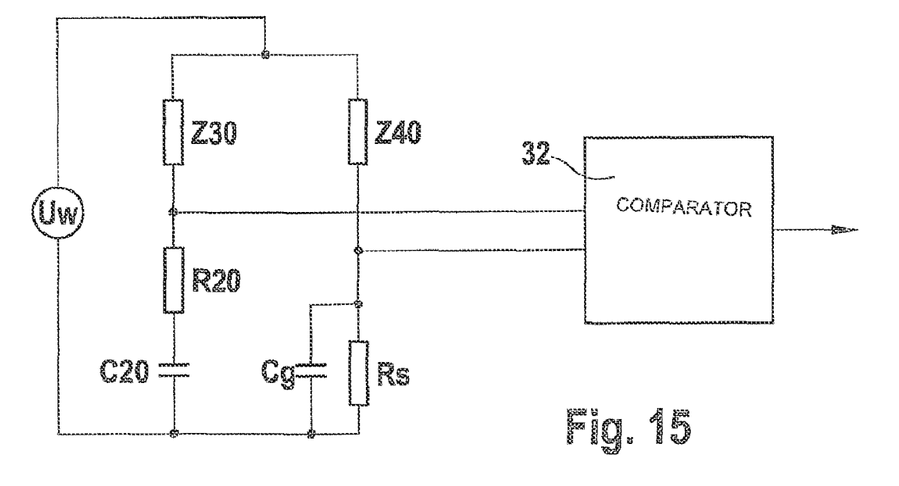
FIG. 15 shows a further implementation having a window comparator.

It is likewise possible, as shown in FIG. 15, to use a comparator 32 in order to output fault signal F directly, for a shutoff or warning, when the tolerance band is exceeded. Comparator 32 can perform a window comparison.

Figure 16:
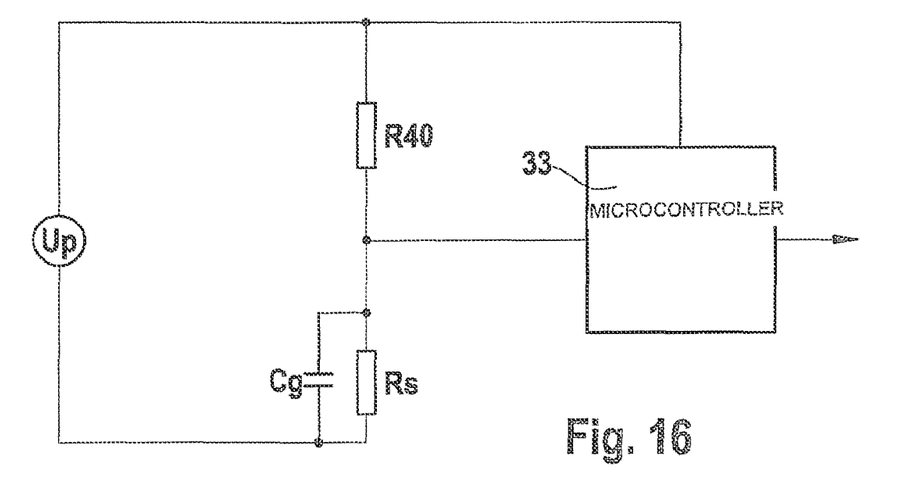
FIG. 16 shows a further implementation with determination of charging time.

FIG. 16 depicts a charging or discharging operation of capacitor Cg through resistors R40 and Rs. When capacitor Cg is discharged and pulse generator Up is switched on, capacitor Cg charges, in accordance with an exponential function (1−exp(−t/τ)), to the value Uschw1=$U_{p,max}$Rs/(Rs+R40). The time to charge to 63% is τ=R40*Cg when Rs >>R40. For R40=100 kΩ and Cg=1 nF, τ=100 us. This is a value that can easily be counted using a microcontroller 33. The pulse application can also be generated by microcontroller 33.

But because it is not always possible to ensure that the capacitor is completely discharged, the threshold selected are, for example, 25% for the count start, and 50% for count completion. The count time is then $t_{25-50}$=τ(ln(0.75)−ln(0.5)). Other thresholds Uschw1 can also be used according to the present invention. It is likewise possible to charge capacitor Cg to an upper limit and then measure the discharge time to a lower value Uschw2 after pulse reversal.

The direct gate capacitance measurement according to the present invention also allows upstream RC elements R6, C6 from FIGS. 9 and 10 to be taken in account as stated above.

Figure 18:
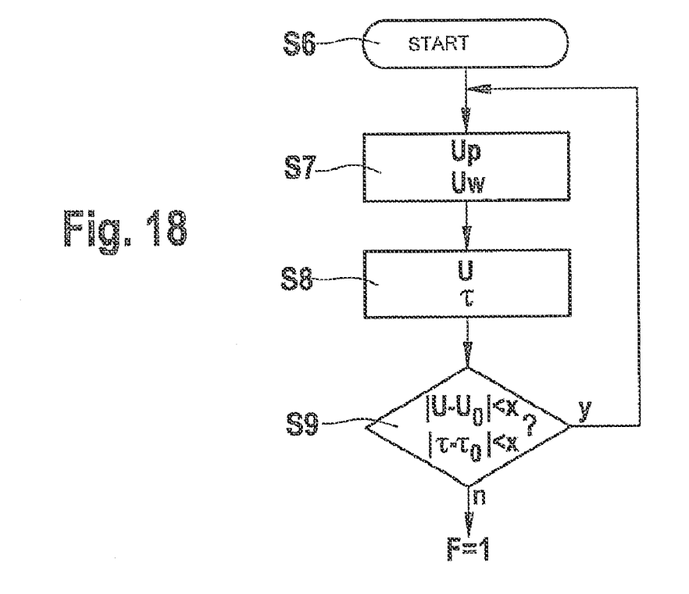
FIG. 18 is a flow chart of a second method according to the present invention.

The method according to the present invention in accordance with the embodiments of FIGS. 11 to 16 is thus, as shown in FIG. 18, started in step S6, after which, in step S7, a DC voltage Up or alternating voltage Uw is applied between gate terminal contact 3g, 9g and ground or the second power electrode terminal contact 3s, 9e; in step S8, an equilibrium shift is measured as a voltage or a charging time or discharge time τ, and is then (corresponding to step S5 of FIG. 17) compared in step S9 with a previously known value.

What is claimed is:

1. A circuit assemblage for checking a functionality of a power transistor, comprising:
    a power transistor having an insulated gate, a first power electrode configured as one of a drain or a collector, and a second power electrode configured as one of a source or an emitter, wherein the first and second power electrode are connected via a first power electrode terminal contact and a second power electrode terminal contact to a power circuit having a DC voltage source and an electrical DC load;
    a control application device having a signal output that is connected via a gate terminal contact to the insulated gate;
    a capacitance measuring device configured for measuring a gate terminal capacitance between the gate terminal contact and the second power electrode terminal contact; and
    an evaluation device configured for comparing the gate terminal capacitance measured by the capacitance measuring device with a gate capacitance and outputting a fault signal as a function of the comparison.

2. The circuit assemblage as recited in claim 1, wherein a ground terminal of the control application device and the second power electrode are together connected to a negative pole of the DC voltage source.

3. The circuit assemblage as recited in claim 2, wherein:
    the capacitance measuring device has an oscillator;
    the gate capacitance to be measured is connected as part of the oscillator; and
    the evaluation device ascertains one of a resonant frequency of the oscillator or a measured variable of the oscillator dependent on the resonant frequency, and the evaluation device compares the one of the resonant frequency of the oscillator or the measured variable of the oscillator dependent on the resonant frequency with a comparison value, and outputs the fault signal as a function of the comparison.

4. The circuit assemblage as recited in claim 3, wherein the oscillator has a coupling capacitor connected to the gate terminal contact, and wherein the oscillator includes a series circuit of at least the gate capacitance and a coupling capacitor.

5. The circuit assemblage as recited in claim 3, wherein the oscillator is a series-tuned Colpitts oscillator, and wherein the gate capacitance is connected as a capacitance that is grounded on one side.

6. The circuit assemblage as recited in claim 3, wherein the oscillator is selected from the group that contains Meissner, Armstrong, parallel-tuned Colpitts, and Hartley oscillators, and wherein a DC voltage separation between the gate capacitance and other elements of the oscillator is achieved by the coupling capacitor.

7. The circuit assemblage as recited in claim 3, further comprising:
    a mixer configured to down-mix an oscillation outputted from the oscillator with a reference oscillation of a reference oscillator into one of a baseband or an intermediate-frequency band and output a mixed signal to the evaluation device, wherein the evaluation device performs an evaluation in the one of the baseband or the intermediate-frequency band and outputs the fault signal as a function of the evaluation.

8. The circuit assemblage as recited in claim 2, wherein a voltage is applied to the gate terminal contact, and wherein an output variable resulting from the applied voltage and the gate terminal capacitance is ascertained.

9. The circuit assemblage as recited in claim 8, wherein an alternating voltage is applied to the gate terminal capacitance, and wherein an equilibrium shift as a function of the gate terminal capacitance is measured.

10. The circuit assemblage as recited in claim 9, wherein the equilibrium shift is measured in a bridge circuit.

11. The circuit assemblage as recited in claim 10, wherein the equilibrium shift of the bridge circuit is read out by one of: a) current measurement at a complex resistance; b) current measurement at a real resistance; c) a differential amplifier; d) a comparator; and e) a comparator serving as a window comparator.

12. The circuit assemblage as recited in claim 8, wherein a DC voltage is applied to the gate terminal capacitance, and wherein one of a charging time to a specified upper threshold voltage or a discharging time to a specified lower threshold voltage is measured.

13. The circuit assemblage as recited in claim 12, wherein the applied DC voltage is pulsed.

14. The circuit assemblage as recited in claim 1, wherein:
    a resistor-capacitor element is connected between the gate terminal contact and the signal output of the control application device; and
    the capacitance measuring device is connected between the resistor-capacitor element and the gate terminal contact.

15. A method for checking a functionality of a power transistor connected via a first power electrode terminal contact and a second power electrode terminal contact to a power circuit having a DC voltage source and an electrical DC load, comprising:
    applying a voltage between a gate terminal contact and a second power electrode terminal contact of the power transistor;
    ascertaining a measured value dependent on a gate terminal capacitance between the gate terminal contact and the second power electrode terminal contact;
    ascertaining whether the measured value lies within a tolerance range of a specified comparison value; and
    outputting a fault signal if the measured value lies outside the tolerance range.

16. The method as recited in claim 15, wherein the gate terminal capacitance is incorporated into an oscillator, and wherein one of a resonant frequency of the oscillator or a measured variable of the oscillator dependent on the resonant frequency is compared with a comparison value.

17. The method as recited in claim 15, wherein a voltage is applied to the gate terminal contact, and wherein an output variable resulting from the applied voltage and the gate terminal capacitance is ascertained.

18. The method as recited in claim 17, wherein a DC voltage is applied, and wherein one of a charging time or a discharging time of the gate terminal capacitance is ascertained and compared with a comparison value.

19. The method as recited in claim 17, wherein an alternating voltage is applied, and wherein an equilibrium shift of a bridge circuit resulting from the gate terminal capacitance is ascertained.

20. The method as recited in claim 17, wherein during operating off times of a connected DC load, the control application device outputs test control signals having a lower amplitude in comparison to a switching voltage necessary for modulation of the power transistor, and wherein a measurement is carried out without switching of the power transistor.

21. The method as recited in claim 17, wherein in the event the measured value lies outside the tolerance range, making an assessment, based on a quantitative evaluation, whether at least one of the following faults exists: a) no contacting to the gate terminal contact; b) no contacting between the second power electrode terminal contact and ground; and c) a short circuit among electrodes of the power transistor.

* * * * *